(12) United States Patent
Schuetz et al.

(10) Patent No.: US 9,360,603 B2
(45) Date of Patent: Jun. 7, 2016

(54) METHOD AND APPARATUS FOR PRODUCING A FRESNEL ZONE PLATE

(75) Inventors: Gisela Schuetz, Wurmberg (DE); Corinne Grévent, Baltmannsweiler (DE); Marcel Mayer, Stuttgart (DE); Brigitte Baretzky, Heilbronn (DE)

(73) Assignee: Max-Planck-Gesellschaft Zur Forderung Der Wissenschaften E.V., Munich (DE)

( * ) Notice: Subject to any disclaimer, the term of this patent is extended or adjusted under 35 U.S.C. 154(b) by 533 days.

(21) Appl. No.: 13/501,327

(22) PCT Filed: Oct. 15, 2010

(86) PCT No.: PCT/EP2010/065492
§ 371 (c)(1),
(2), (4) Date: Jun. 22, 2012

(87) PCT Pub. No.: WO2011/054651
PCT Pub. Date: May 12, 2011

(65) Prior Publication Data
US 2012/0258243 A1 Oct. 11, 2012

(30) Foreign Application Priority Data

Oct. 26, 2009 (DE) .......................... 10 2009 050 688
Mar. 11, 2010 (DE) .......................... 10 2010 010 937

(51) Int. Cl.
*G02B 5/18* (2006.01)
*C23C 16/455* (2006.01)
*G21K 1/06* (2006.01)

(52) U.S. Cl.
CPC ........ *G02B 5/1876* (2013.01); *C23C 16/45525* (2013.01); *G21K 1/06* (2013.01)

(58) Field of Classification Search
CPC .......................... G02B 5/1876; C23C 16/45525
See application file for complete search history.

(56) References Cited

U.S. PATENT DOCUMENTS

| 2,679,474 A | 5/1954 | Pajes |
| 3,542,453 A | 11/1970 | Kantor |

(Continued)

FOREIGN PATENT DOCUMENTS

| DE | 1805058 | 5/1969 |
| EP | 55554 A1 * | 7/1982 |

(Continued)

OTHER PUBLICATIONS

Examination Report corresponding to German Application No. 10 2010 010 937.1, mailed Apr. 5, 2012.

(Continued)

*Primary Examiner* — James M Mellott
(74) *Attorney, Agent, or Firm* — Lathrop & Gage LLP (57) ABSTRACT

A method of producing a Fresnel zone plate (15) comprising:
making available a substrate (1, 4, 7) which is rotationally symmetrical with respect to its center axis (1a, 4a, 7a);
applying layers (2a-d; 5a-d; 8a-d; 11) following in succession by means of an atomic layer deposition (ALD) method to faces (1b-c; 4b-c; 7b-c) of the substrate (1, 4, 7) without rotation of the substrate (1, 4, 7) in order to form a coated substrate, and
severing (3a, b; 6a, b; 9a, b) at least one slice (13) from the coated substrate (1, 4, 7), by the coated substrate (1, 4, 7) being divided at least once at a right angle to the center axis (1a, 4a, 7a).

19 Claims, 5 Drawing Sheets

(56) References Cited

U.S. PATENT DOCUMENTS

| | | | |
|---|---|---|---|
| 4,643,752 A * | 2/1987 | Howard et al. | 65/399 |
| 5,114,513 A * | 5/1992 | Hosokawa et al. | 156/150 |
| 5,382,342 A | 1/1995 | Bionta et al. | |
| 5,719,915 A | 2/1998 | Koike et al. | |
| 6,391,803 B1 * | 5/2002 | Kim | C23C 16/345 |
| | | | 257/E21.271 |
| 7,268,012 B2 * | 9/2007 | Jiang et al. | 438/106 |
| 7,365,918 B1 * | 4/2008 | Yun et al. | 359/742 |
| 2005/0007675 A1 * | 1/2005 | Matsumoto et al. | 359/652 |
| 2006/0134433 A1 | 6/2006 | Maula et al. | |
| 2006/0204189 A1 * | 9/2006 | Sasaki | C03B 37/01807 |
| | | | 385/123 |

FOREIGN PATENT DOCUMENTS

| | | | |
|---|---|---|---|
| JP | 63-007373 | | 1/1988 |
| JP | 63007373 A * | | 1/1988 |
| JP | 01003602 | | 1/1989 |
| JP | 01003602 A * | | 1/1989 |
| JP | 2001324459 | | 11/2001 |
| JP | 2002008575 | | 1/2002 |
| JP | 2004145006 | | 5/2004 |
| JP | 2004145066 | | 5/2004 |
| JP | 2005010757 | | 1/2005 |
| WO | WO 2004/012236 | | 2/2004 |

OTHER PUBLICATIONS

International Search Report corresponding to International Application No. PCT/EP2010/065492, mailed Jan. 28, 2011, including English Translation.

International Preliminary Report on Patentability corresponding to International Application No. PCT/EP2010/065492, mailed May 18, 2012.

Notification of Reasons for Refusal corresponding to Japanese Application No. 2012-535730, drafted May 13, 2014 (includes English translation on pp. 4-6).

* cited by examiner

METHOD AND APPARATUS FOR PRODUCING A FRESNEL ZONE PLATE

CROSS-REFERENCE TO RELATED APPLICATIONS

This application is the U.S. national stage application under 35 U.S.C. §371 of International Application No. PCT/EP2010/065492, filed Oct. 15, 2010, which claims the benefit of German Patent Application DE102009050688.8 filed Oct. 26, 2009 and German Patent Application DE102010010937.1 filed Mar. 11, 2010, each of which is hereby incorporated by reference.

The invention relates to a method and an apparatus for producing a Fresnel zone plate, which after the addition of layers following in succession has taken place allows a plurality of Fresnel zone plates to be produced.

X-ray microscopy has proved successful as a complementary characterizing method to light and electron microscopy. Limits are set by focusing optics to the imaging of objects with X-ray radiation. The Fresnel zone plate has hitherto been one of the most popular and successful focusing devices for focusing X-rays. Both the optimization of the resolution of Fresnel zone plates of this type and a simplification of its production process are sought.

It is known that against the background of a rapid development of technologies in the nanometer range and the significant effects thereof for the development of science, in particular for use in biology, chemistry, and from material sciences to environmental and biomedical sciences, a further improvement of suitable analytical tools in the nanometer range is highly desirable.

X-ray microscopy combines chemical selectivity with high spatial and temporal resolution.

In addition, X-ray microscopy permits the simultaneous use of other X-ray-based methods which make possible the investigation of physical, magnetic, chemical and structural properties of substances in the micrometer and nanometer range. In this case the possibilities range from microspectroscopy, for example of pXANES, of microchemical analysis, of X-ray magnetic circular dichroism (XMCD), to temporally resolved microscopy. A further advantage is the low outlay in the preparation of samples as compared with transmission electron microscopy. By way of example, it is not necessary, as in the case of electron microscopy, for a thin sample of this type to be produced beforehand, which frequently results in the destruction of or damage to the sample material. X-ray microscopy is frequently therefore also used in life sciences.

The potential spatial resolution of X-ray microscopy lies in the order of magnitude of the wavelength of the light used. In the case of operation of the X-ray microscope with soft X-ray radiation (wavelength of from 0.5 to 10 nm, energy of 120 eV-2 keV), the photon energy matches the K absorption edges of light elements, and a very good contrast between organic material and water as well as a good depth of penetration in micrometer-thick samples [are] achieved. In the case of operation with harder X-ray radiation the access to the K absorption edges of medium-heavy elements and to the L and M absorption edges of heavy elements is made possible. The greater depth of penetration in this energy range additionally allows the investigation of thicker samples.

X-ray lenses are of fundamental importance for the performance and efficiency of X-rays in X-ray microscopy. Since X-rays interact only very weakly with matter, i.e. the samples to be investigated, although on the one hand tomography studies can advantageously be carried out and thick materials can be investigated, on the other hand focusing of these X-rays can be carried out only with very great difficulty. As before, the improvement of X-ray lenses remains a major challenge. For focusing by X-ray lenses both the refraction and the reflection and diffraction of X-rays have been used. Until now the best focusing properties have been achieved in the case of Fresnel zone plates, i.e. on the basis of the diffraction of X-rays.

A Fresnel zone plate comprises a plurality of concentric rings, also referred to as zones, which follow in succession and in which X-ray-absorbing and X-ray-transparent material alternates. Zone plates use constructive interference of X-rays from adjacent zones to produce a focus. The focal length f of a zone plate is a function of its diameter, the thickness of the outermost zone $\Delta r$ and the wavelength of the X-ray radiation used. The resolution of the zone plate is closely related to the thickness of the outermost zone $\Delta r$. In this case the so-called Rayleigh resolution is limited to 1.22 $\Delta r$.

The resolution capacity of Fresnel zone plates (FZP) has not yet reached its physically achievable theoretical limits, since the creation of zones with low thicknesses with the production methods used hitherto remains as difficult as before.

The efficiency can be regarded as being a further factor in the production of Fresnel zone plates. The theoretical efficiency of standard Fresnel zone plates, so-called amplitude zone plates, comprising absorbent and transparent rings alternating with one another is limited in the first order to approximately 10%. Although other types of zone plates have a higher degree of efficiency, it appears that one of the main problems, both of standard Fresnel zone plates and of alternative structures, lies in the difficulty of achieving the theoretically predicted degrees of efficiency on account of limitations in the production processes.

The height or the aspect ratio of the zone plate is one of the important variables which have to be taken into consideration when determining suitable production methods for Fresnel zone plates. In general, and in particular for amplitude zone plates which are used with high energy, the zone plates have to have a high aspect ratio. The higher the energy of the X-rays to be focused, the greater the optimum height of the zone plate which is required for the focusing. On account of the fact that technical limits are encountered in the current production methods, the production of zone plates with a high aspect ratio still remains very difficult.

To summarize, the following important factors should be noted as regards the problems for the production of zone plates: the resolution, the efficiency, the aspect ratio and the outlay of the manufacturing process. What is aimed for is a reliable manufacturing process which permits the production of Fresnel zone plates with both thin to very thin outermost zones and high aspect ratios.

The technologies used at present for the formation of high-resolution Fresnel zone plates frequently come from the field of electron beam lithography. In these methods, essentially one zone plate pattern is inscribed in a resist (lacquer sensitive to electron beams), as a result of which after its development a mould is formed which is then filled with metal by galvanization. The subsequent removal of the resist results in the zone plate.

Another generally known technique for producing Fresnel zone plates is the so-called "sputtered-sliced method": in this method thin layers of absorbent and transmitting material are applied alternately to a rotating wire, as a result of which the suitable zone plate pattern is produced. The coated wire or parts thereof can then be grinded and polished to the necessary thickness.

The method on the basis of lithography is one of the most popular methods to date of producing zone plates in terms of the resolution. It allows high resolutions with the thinnest outermost zones. This method is subject to certain limits, however, as a result of the diameter and scattering of the electron beams in the electron beam resist. The achievement of higher resolutions, in particular the transmission of zones with a very small structural width, has not been successful until now, nor has it yet been made clear whether structures of this type can be transmitted with the aid of electron beam lithography.

Various methods have been proposed in order to improve the limited resolution. By way of example, in the "double patterning" overlaying method quite a high resolution is possible, but in this case a highly precise orientation technique is required, which makes the method time-consuming and costly. The "zone doubling" method, in which lithography and thin-layer deposition methods are combined, makes it possible to produce test structures with higher resolutions, but reduces the efficiency of the lens to a considerable degree since it makes it necessary to deposit an X-ray-absorbing material over the entire zone plate.

It has been found that the "sputtered-sliced" method has a limited degree of accuracy with respect to the resolution as compared with the lithography method and is not suitable for the design of high-resolution Fresnel zone plates, as a result of which it is rarely used.

To summarize, it should be noted according to the prior art:

With respect to the resolution of Fresnel zone plates, in particular for the soft X-ray range, the best results have been achieved until now with the electron beam lithography method.

The efficiency of Fresnel zone plates is limited in theory and in practice is further restricted by inaccuracies of the different production methods which can lead to defective zones. Alternative zone plate structures which have a higher degree of efficiency can be implemented only with difficulty with the previously known production methods.

High aspect ratios are necessary for high-resolution Fresnel zone plates which are to be used in a high energy range. The current electron beam lithography methods are capable of being used to a limited degree in this case. Consequently high resolutions for hard X-ray radiation are difficult.

The electron beam lithography method seems at present to be one of the preferred methods of producing FZPs with a high resolution ability. The further improvement of the resolution, however, is achieved only with a considerable additional outlay.

Consequently the object of the invention is to make available a method and an apparatus for producing a Fresnel zone plate, which allows a simple and inexpensive production of a Fresnel zone plate which has a high resolution, low layer thicknesses, a high aspect ratio and error-free layers or zones.

This object is attained with respect to the method by the features of claim 1 and with respect to the apparatus by the features of claim 14.

An essential aspect of the invention lies in the fact that the method according to the invention for the production of a Fresnel zone plate comprises the following steps:

Making available a substrate which is rotationally symmetrical, preferably elongate, with respect to its centre axis, preferably longitudinal centre axis;

Applying layers following in succession by means of an atomic layer deposition (ALD) method to faces, preferably of the substrate without rotation of the substrate in order to form a coated, preferably elongate, substrate.

Severing at least one slice from the coated, preferably elongate, substrate, in that the coated substrate is divided at least once at a right angle to the centre axis, in particular longitudinal centre axis.

A simple production of Fresnel zone plates is made possible by a production method of this type according to the invention, since a rotation of the substrate is not necessary in the production method in order to form a coated elongate substrate. In fact, by means of the ALD method it is made possible for rotation-free machining to be possible on the one hand and for very thin layers for forming a high resolution of the Fresnel zone plates obtained to be obtained on the other hand. This is because the thinner the layers of the Fresnel zone plates, the better the resolution. This applies in particular to the outermost layer, i.e. the most recently applied layer of the coated elongate substrate in the case of layers applied on the outside. In the case of layers applied on the inside this is the layer of the coated substrate which is applied first.

A pre-condition for a good quality of the Fresnel zone plates, which are cut in the form of slices from the elongate substrate, is a smooth surface of the substrate with a slight surface roughness and a slight deviation in the symmetry of the substrate with respect to the longitudinal centre axis.

Fresnel zone plates produced in this way can, in addition, have a high aspect ratio and can be used with high X-ray energy. This applies for example to the use of the Fresnel zone plates with hard X-ray radiation. The resolution figures of the Fresnel zone plates obtained during this can be around 5-100 nm, preferably around 15 nm and below.

On account of using an ALD method for the application of the individual layers which are present in a usually circular form around the substrate with respect to the cross-section of the coated substrate, a precise monitoring of the thickness and the composition of the layers is made possible. This is made possible by the use of the atomic layer deposition method, which corresponds to the atomic layer deposition. In addition, as a result of this, very thin layers are produced in order to obtain a high aspect ratio and a high resolution.

In addition, by using the ALD method, it is possible for layers with thicknesses of only a few nanometers and below to be applied. The outermost zone or layer can have for example a layer thickness of a few nanometers from a range namely for example of 5-100 nm, in a more preferred manner 5-30 nm, and preferably below 15 nm or even down to 1 nm, which results in a considerable advantage with respect to the standard electron beam lithography method used until now.

In addition it becomes unnecessary for a rotation of the substrate to be carried out during the application of the layers as in the case of the standard "sputtered sliced" method. In fact, a mechanical vibration of the substrate can be prevented by this, which leads to a better quality result of the individual layers and thus to zone structures with fewer faults. This in turn has an advantageous effect with respect to an improved resolution and an improved efficiency which thus comes closer to the theoretically achievable figure.

The use of the ALD method provides a varied choice of materials for the layers. These layer materials and optionally material compositions can be controlled in a precise manner in their composition ratios. It is possible to decide for each individual atomic layer which material is applied. As a result, the path for the production of Fresnel zone plates with structures controlled in a highly precise manner is smoothed. By way of example, kinoform zone plates known in their form from the prior art can be produced in a simple manner as a result with a theoretical degree of efficiency of 100%.

In accordance with a preferred embodiment a cylindrical element, such as a wire, is used as an elongate substrate. When using a wire of this type the outer face is provided with the individual layers by means of the ALD method.

Alternatively, for example, it is possible to use a cylindrical element which has a centrally arranged through opening, for example in the form of a bore, in the direction of its longitudinal centre axis. Cylindrical elements of this type can be provided on the inside, i.e. on the walls of the through opening, with the individual layers. As an alternative or in addition, outer walls of a cylindrical element of this type can be provided with layers.

The elongate substrate can be designed in the form of a tapered or frustoconical element. In the same way, any other symmetrical three-dimensional shapes can be used. By way of example, as viewed in cross-section an ellipsoid can be used as the elongate substrate. In the same way, elongate substrates, which have a round shape in their cross-section but display different diameters in the longitudinal extension of the substrate, are possible. In addition, it is possible to use a spherical shape or a portion thereof for the shape of the substrate.

The successive layers of the cylindrical, tapered or frustoconical element are cut off together with the substrate in the manner of slices at a right angle to the longitudinal centre axis. In this case slices with very small thicknesses, such as for example from a range of a few 10 nm to 10 µm, can be used. To this end, conventional cutting tools, separating tools, conventional separating methods or even an FIB (focused ion beam) method is or are used.

In this way, a coated elongate substrate, which results in a plurality of individual Fresnel zone plates, i.e. of severed slices, can be produced by means of a production method which takes place once.

The severed layers are reduced in their slice thickness by grinding or polishing procedures in order to obtain the desired dimension of the slice thickness.

The severed slice is applied to a further substrate in order that it can then be used in a fixed form as a Fresnel zone plate. The outermost layer advantageously has a layer thickness from a range of 5-100 nm, in a more preferred manner 5-30 nm, and preferably below 15 nm down to 1 nm. The zone widths of a zone plate for use at 1200 eV with for example an overall diameter of 38 µm and an outermost zone width of 35 nm vary from 35 nm to 477 nm from the outside to the inside.

Glass, metal, ceramic materials or polymers are frequently used as the substrate.

It is also possible, of course, for any other materials which have the property of a slight surface roughness and slight deviations in the rotational symmetry to be used.

An apparatus for performing the method, as described above, advantageously has a severing device or cutting device which severs or cuts off the individual slices from the elongate substrate. In the same way, an apparatus is provided for applying the atomic layer deposition method and an apparatus is provided for fixing without carrying out a rotation of the substrate during the application of the individual layers by the ALD method.

In addition, an apparatus can be used for polishing or grinding the individual severed slices in order to produce a desired thickness of the slices.

As already mentioned, a plurality of Fresnel zone plates can be cut out of an individual substrate, irrespectively of how long this substrate has been made, for example in the form of a wire. By means of cutting coated substrates into slices, a production of Fresnel zone plates on a larger scale can be carried out for the case in which a wire is used. After the application of the individual layers to the wire a plurality of Fresnel zone plates can be cut off in the manner of slices. As a result, the production method used here becomes efficient and relatively simple as compared with the electron beam lithography process. In the case in which electron beam lithography is used the production yield is relatively low since many Fresnel zone plates have to be produced in order to obtain some of them with the desired focusing effect. In this way, the production according to the invention of the Fresnel zone plates is inexpensive and efficient.

Further advantageous embodiments are set out in the subclaims.

Advantages and expedient properties are evident from the following description with the drawing. In the drawing

Figure 1:
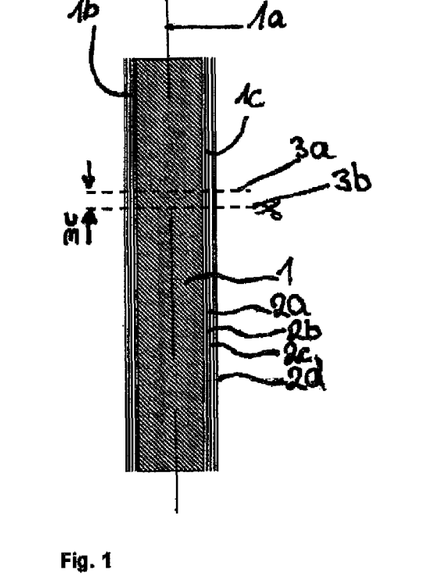
FIG. 1 is a first cross-sectional illustration of a coated elongate substrate for producing a plurality of Fresnel zone plates in accordance with the method according to the invention.

A first embodiment of the invention with a substrate in the shape of a cylinder, as represented by a wire, is reproduced in a cross-sectional illustration in FIG. 1. As shown in FIG. 1, a wire 1 has a longitudinal centre axis 1a and, in accordance with this cross-sectional illustration, a left-hand outer wall 1b and a right-hand outer wall 1c, the outer walls 1b and 1c being portions of a cylindrical covering.

A substrate 1 of this type, like the substrates of the following embodiments, has a virtually ideal rotational symmetry about the optical axis or longitudinal centre axis 1a thereof. This means that the substrate, for example with a diameter of approximately 30 µm, has a roundness with respect to the longitudinal centre axis with a deviation of less than 25-50 nm. In this case the roundness is defined as the deviation from an ideal circle: If the circle is not ideal and is designed to form an ellipse with an a axis and a b axis, then the following applies for the roundness:

$$\text{Roundness} = a - b$$

A virtually ideal symmetry with respect to the optical axis or longitudinal centre axis of the substrate used is necessary in order to prevent optical aberrations. Deviations in the positioning of the zones or layers have in fact grave consequences for the efficiency of the Fresnel zone plates. The different possible degrees of positioning accuracy in conjunction with the production method are ellipticity, non-concentricity and radial shifting. They lead to the following aberrations in each case: astigmatism, coma and spherical aberrations. High-precision demands are thus considered to be necessary in order to obtain satisfactory focusing properties for the Fresnel zone plates. In the same way, cones, ellipsoids or any other axially symmetrical substrates such as for example a sphere of glass or any other materials can be used. By way of example, a frustoconical shape as shown in FIG. 2 or a cylindrical shape with a through opening as viewed in the direction of the longitudinal centre axis and as shown in FIG. 3 can be used.

In FIG. 1 the individual layers applied are indicated by means of the references 2a to 2d. The first layer 2a is applied first of all, after that by means of the ALD method the layer 2b, then the layer 2c and finally the layer 2d. The actual number and thickness of the individual layers is pre-set by the zone plate formula and typically amounts to from 100 to several hundred layers.

A subsequent separation method, as indicated by the two silhouettes 3a and 3b, puts the cylinder which is shaped in an elongate manner and which constitutes the coated substrate into individual slice shapes which then, after polishing has taken place or a grinding procedure has taken place, constitute the Fresnel zone plate. A plurality of separations in accordance with the silhouettes 3a and 3b indicated merely stylistically leads to a plurality of Fresnel zone plates which result from a substrate 1 of this type coated in an elongate manner.

Figure 2:
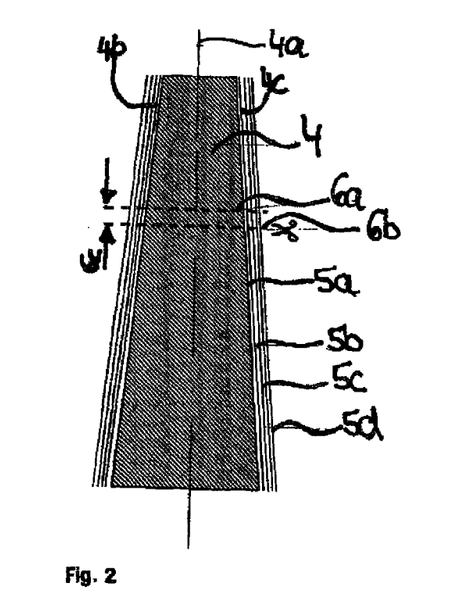
FIG. 2 is a cross-sectional illustration of a second coated elongate substrate for producing a plurality of Fresnel zone plates in accordance with the method according to the invention.
Figure 3:
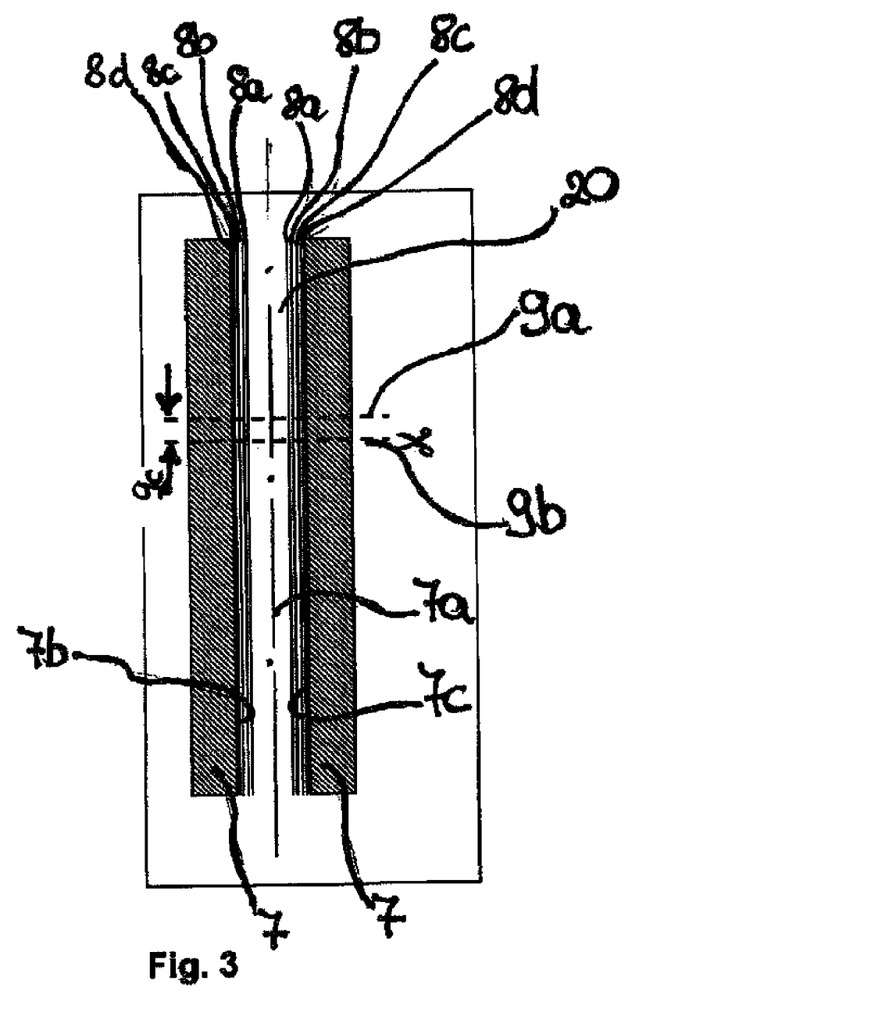
FIG. 3 is a cross-sectional illustration of a coated elongate substrate for producing a plurality of Fresnel zone plates in accordance with the method according to the invention.

The frustoconical substrate 4 reproduced in FIG. 2 has in the same way outer walls 4b and 4c which constitute portions of a frustoconical covering, since in FIG. 2 a cross-section is reproduced. The longitudinal centre axis 4a shows the symmetry of this frustoconical shape.

The layers 5a to 5d are applied in the sequence 5a, 5b, 5c and 5d without rotation by means of the ALD method.

After that, a severing of the coated elongate substrate takes place in accordance with the cutting points 6a and 6b arranged stylistically in order to obtain a slice or a plurality of slices in this way, which on the basis of the frustoconical shape of the substrate produce Fresnel zone plates with a different diameter and inclined zones and which can thus optionally have a different purpose of use of the zone plates obtained from them with respect to focusing ability, their resolution and the like.

The slices preferably have a height of from a few micrometers to a few 100 nanometers. This corresponds to the thickness of the slice.

Fresnel zone plates produced in this way have no natural upper limit with respect to the aspect ratio. After the layers have been applied to the substrate, the height or thickness of the slice which can be cut out of the substrate is as high as is required: There is consequently no upward limit and thus virtually no limit of the aspect ratio. Since the preparation of zone plates is intended for a high resolution, there is a requirement on the one hand for a cutting and thinning process which does not damage the fine layer structure and on the other hand for layers which are suitable for being cut into slices. In this case it has been found that the method with a focused ion beam (FIB) is a suitable method for cutting the Fresnel zone plates into slices and thinning them. Consequently an ion beam separating apparatus will constitute a severing or cutting apparatus of this type.

In the same way it has been found that the alternating application of layers of $Ta_2O_5$ and $Al_2O_3$ to a glass wire, as illustrated diagrammatically in FIG. 1, leads to a resistant final coating which allows a further cutting into slices and thinning of the coating substrate in a simple manner.

In this case $Ta_2O_5$ is provided as an X-ray-absorbing material and $Al_2O_3$ is provided as an X-ray-transparent material with an excellent uniformity with respect to its distribution and a good precision with respect to its layer thickness by means of the ALD method. It is advantageous for example for over 100 layers of $Ta_2O_5$ and $Al_2O_3$ with outermost layer thicknesses in a range of from 5 to 100 nm to be applied to the substrate mentioned above.

It is possible for the substrate mentioned above, namely a glass wire with alternating layers of $Ta_2O_5$ and $Al_2O_3$, to be cut into slices and to be thinned by the following method.

After the layers have been applied to the fibre or to the wire respectively by means of atomic layer deposition (ALD), the coated glass fibre is transferred to a double-beam instrument which is a combination of an arrangement with a focused ion beam and a scanning electron microscope in which the following processing steps are carried out:
  the outer layers are protected by the application of platinum;
  a slice with a width of approximately 5 μm is cut out with the focused ion beam;
  the slice is transferred by means of a micromanipulator (omniprobe) to a carrier structure (TEM grid) and is fixed thereon with platinum;
  the slice is thinned or narrowed respectively in the arrangement with a focused ion beam, i.e. is reduced in its thickness: In this case a thickness of less than 600 nm can be achieved, without the sensitive layer structure being destroyed in this case.

In the centre of the Fresnel zone plate a screen in the form of a circular disc and impermeable to X-ray radiation is applied by means of a focused ion beam.

As shown in FIG. 3, a small tube or a capillary can be used as an alternative to the glass wire, in which case the application of the layers takes place on the inside on the walls of the through opening 20. A rotation of the substrate 7 does not take place in this case either. The inner walls of the substrate 7 are designated 7b and 7c. The longitudinal centre axis is designated 7a.

The individual layers are represented by the references 8a to 8d. The substrate 7 is of course designed in the shape of a cylinder. Only a cross-section of it is illustrated in FIG. 3.

After the coating has taken place a separating procedure is carried out, again which is reproduced diagrammatically in accordance with FIG. 3 in the references 9a and 9b. In this case individual slices are to be produced which have a layer thickness 9c which can be reduced in a subsequent narrowing method. The layer thicknesses of the slices which are reproduced in FIGS. 1 and 2 and which are to be produced from the substrates indicated therein are indicated by 3c and 6c.

Figure 4:
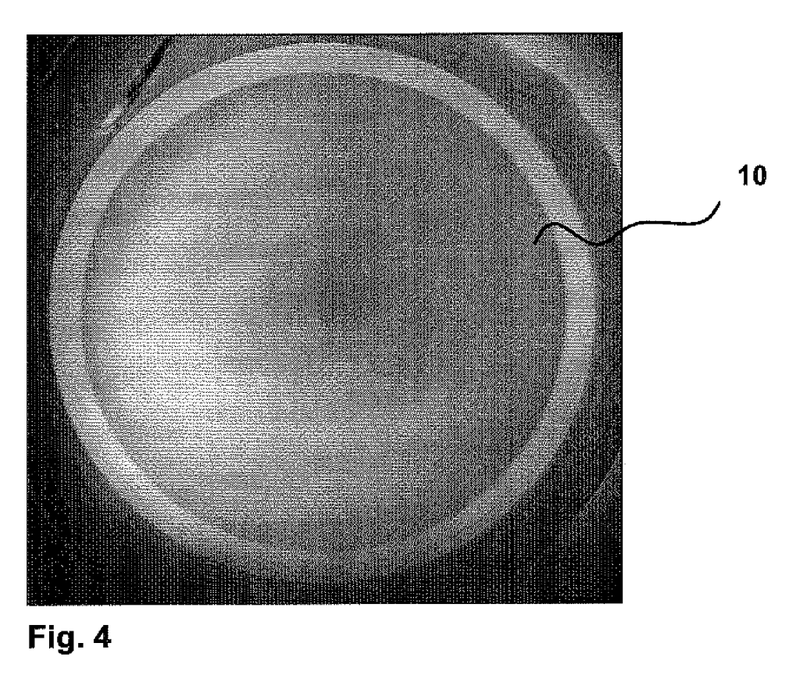
FIG. 4 is a full-field microscopic imaging of a coated cylindrical substrate in cross-section.

A glass wire 10 is illustrated in cross-section in FIG. 4. This is an X-ray microscope image. It is evident from the illustration that a deviation from the optimum roundness is very slight, i.e. it corresponds to less than 25 to 50 nm in the case of a diameter of approximately 30 μm.

Figure 5:
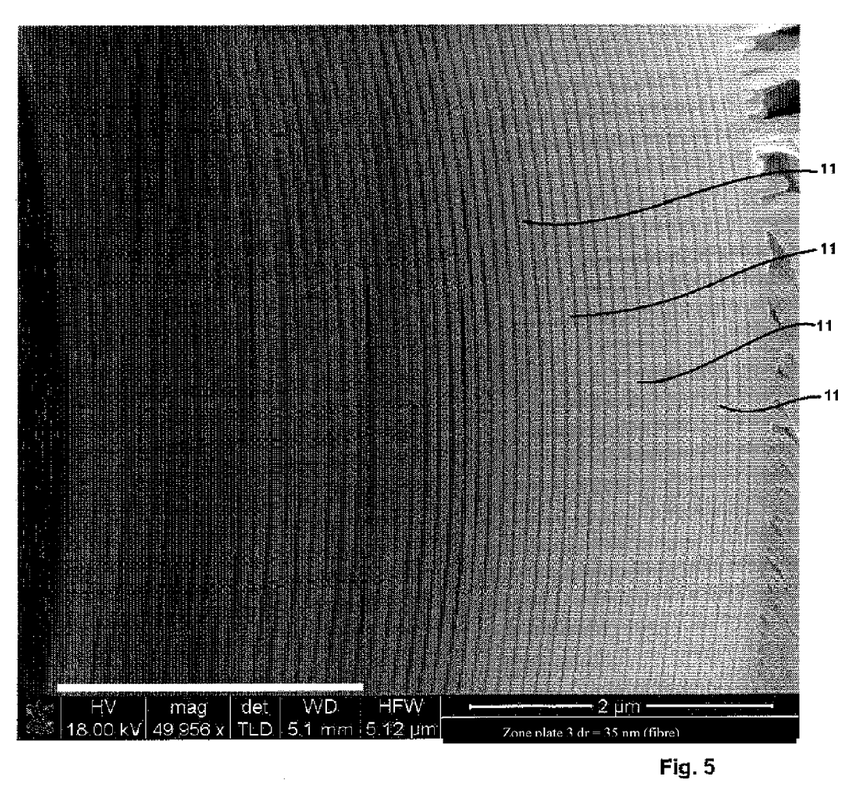
FIG. 5 is a SEM (scanning electron microscopy) recording of a cut-away portion of the layers of a coated substrate in accordance with the method according to the invention.

A cut-away view of the individual layers 11 applied is reproduced by means of an REM image in FIG. 5. It is evident from this illustration that the layers display sharp and smooth boundary faces over the entire coating width.

Figure 6:
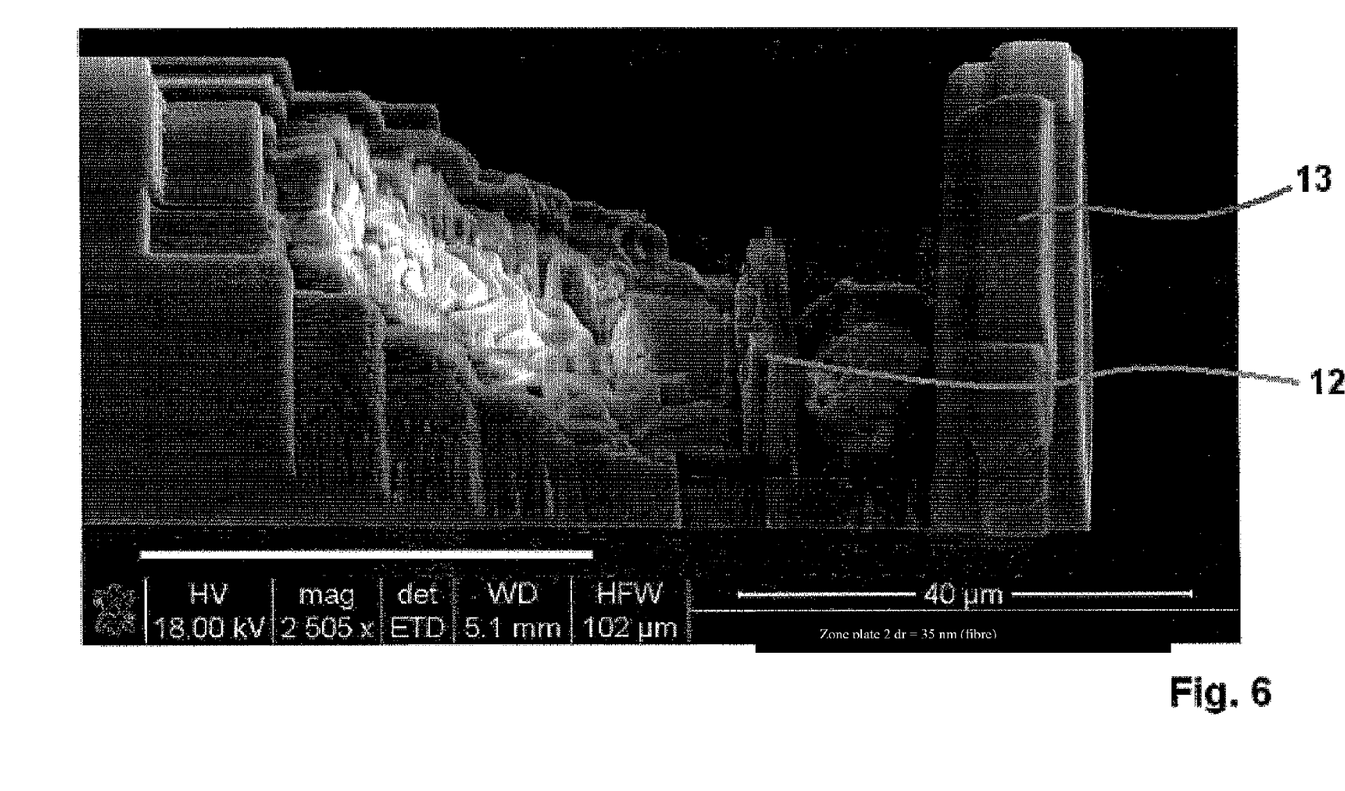
FIG. 6 is a SEM recording of a coated wire during a severing procedure.

In FIG. 6 a side view of the wire during the severing procedure is illustrated in an REM image. The numeral 12 designates the cut and 13 indicates the slice to be severed (Fresnel zone plate).

The production method according to the invention and the apparatus according to the invention [are] capable of being used to produce Fresnel zone plates which can be used both for hard and for soft X-ray radiation with a high resolution, a high aspect ratio and with a low fault rate.

All the features disclosed in the application documents are claimed as being essential to the invention, insofar as they are novel either individually or in combination as compared with the prior art.

LIST OF REFERENCES 1, 4, 7 wire, substrate
1a, 4a, 7a longitudinal centre axis 1b, 1c, 4b, 4c outer walls
2a, 2b, 2c, 2d example illustration [of] layers applied by means of ALD
5a, 5b, 5c, 5d example illustration [of] layers applied by means of ALD
8a, 8b, 8c, 8d example illustration [of] layers applied by means of ALD
3a, 3b, 6a, 6b cuts
11 layers
9a, 9b, 12 cuts
7b, 7c inner walls
3c, 6c, 9c layer thicknesses
10 glass fibres
13 severed slice

We claim:

1. A method of producing a Fresnel zone plate, virtually without limitation of an aspect ratio, comprising:
    making available a substrate of glass which is rotationally symmetrical with respect to its centre axis;
    applying layers following in succession by means of an atomic layer deposition (ALD) method to faces of the substrate without rotation of the substrate at a thickness, wherein the thickness of each individual layer, as applied, is identical to a thickness of a corresponding zone of the zone pate in order to form a coated substrate; and
    severing at least one slice from the coated substrate, by the coated substrate being divided at least once at a right angle to the centre axis.

2. A method according to claim 1, characterized in that an elongate substrate, the longitudinal centre axis of which represents the centre axis, is used as the substrate, wherein the faces constitute longitudinal sides of the elongate substrate.

3. A method according to claim 2, characterized in that a cylindrical element is used as an elongate substrate.

4. A method according to claim 3, characterized in that the cylindrical element has a centrally arranged through opening in the direction of its longitudinal centre axis.

5. A method according to claim 4, characterized in that the layers following in succession are applied to the cylindrical element with the through opening on the inside along walls of the through opening.

6. A method according to claim 3, characterized in that the layers following in succession are applied to the cylindrical element or a tapered or frustoconical element on the outside.

7. A method according to claim 2, characterized in that a tapered or frustoconical element is used as the elongate substrate.

8. A method according to claim 2, characterized in that a wire is used as an elongate substrate.

9. A method according to claim 1, characterized in that a sphere or a portion thereof is used as the substrate.

10. A method according to claim 1, characterized in that the severed slice is reduced in its slice thickness by grinding and/or polishing procedures.

11. A method according to claim 1, characterized in that the severed slice is applied to a further substrate.

12. A method according to claim 1, characterized in that the layers with the greatest radius with a layer thickness from a range of 1-150 nm are applied.

13. A method according to claim 1, characterized in that the layers are formed alternately from $Ta_2O_5$ and $Al_2O_3$.

14. A method according to claim 1, characterized in that the slice with a slice thickness from a range of from 100 nm to 10 µm is severed.

15. A method according to claim 1, characterized in that the layers with the greatest radius are applied by atomic layer deposition with a layer thickness from a range of 1-15 nm.

16. A method according to claim 1, characterized in that the actual number and thickness of the individual layers is pre-set by a zone plate formula.

17. A method according to claim 1, characterized in that the substrate has a roundness with respect to the longitudinal centre axis with a deviation of 25-50 nm.

18. A method according to claim 1, characterized in that the layers display sharp and smooth boundary faces over the entire coating width.

19. A method according to claim 1, characterized in that the substrate has a roundness with respect to the longitudinal centre axis with a deviation of less than 50 nm.

* * * * *